United States Patent [19]

Van Uitert et al.

[11] 4,013,501
[45] Mar. 22, 1977

[54] GROWTH OF NEODYMIUM DOPED YTTRIUM ALUMINUM GARNET CRYSTALS

[75] Inventors: Le Grand Gerard Van Uitert, Morris Township, Morris County; George John Zydzik, Columbia, both of N.J.

[73] Assignee: Bell Telephone Laboratories, Incorporated, Murray Hill, N.J.

[22] Filed: May 27, 1976

[21] Appl. No.: 690,613

[52] U.S. Cl. .............................. 156/605; 156/624; 252/301.4 R; 423/263

[51] Int. Cl.$^2$ .................... B01J 17/04; C01F 17/00

[58] Field of Search ... 156/605, 606, 624, DIG. 61, 156/DIG. 63, DIG. 80; 423/263; 252/301.4 R

[56] References Cited

UNITED STATES PATENTS

| | | | |
|---|---|---|---|
| 2,957,827 | 10/1960 | Nielsen | 156/624 |
| 3,050,407 | 8/1962 | Nielsen | 156/624 |
| 3,079,240 | 2/1963 | Remeika | 156/624 |
| 3,386,799 | 6/1968 | Grodkiewicz et al. | 156/624 |
| 3,697,320 | 10/1972 | Hiskes | 156/624 |

OTHER PUBLICATIONS

Linares, "Growth of Garnet Laser Crystals," Solid State Communications 2 No. 8, pp. 229–231 (1964).
LeFever et al., "Growth of Single Crystals of Yttrium Aluminum Garnet from Lead Oxide–Lead Fluoride Melts," J. Applied Physics 32, No. 5, pp. 962–963 (1961).
Van Uitert, "Growth of Large Optical Quality Yttrium and Rare Earth Aluminum Garnets," J. Amer. Ceramic Soc., vol. 48, no. 2, pp. 105–108 (1967).
Grodkiewicz, et al., "Growth of Large Yttrium and Rare-Earth Aluminum 2nd Iron Garnets," Crystal Growth, Suppl. J. of Physics and Chem. of Solids, pp. 441–444 (1967).

Primary Examiner—Jack Sofer
Assistant Examiner—Barry I. Hollander
Attorney, Agent, or Firm—Peter V. D. Wilde

[57] ABSTRACT

A method is disclosed for growing neodymium doped yttrium aluminum garnet crystals from a melt containing constituent oxides, lead oxide, lead fluoride, and boron trioxide. By subjecting the melt to a controlled temperature cycle while maintaining a temperature gradient in the melt, large size, high quality crystals are obtained. Crystals produced by the disclosed method are suited for laser application.

9 Claims, 2 Drawing Figures

GROWTH OF NEODYMIUM DOPED YTTRIUM ALUMINUM GARNET CRYSTALS

BACKGROUND OF THE INVENTION

1. Field of the Invention

The invention is concerned with methods for growing single crystals by flux methods.

2. Description of the Prior Art

Compared with other single crystal garnets such as gadolinium gallium garnet $Gd_3Ga_5O_{12}$ or gadolinium aluminum garnet, $Gd_3Al_5O_{12}$, yttrium aluminum garnet $Y_3Al_5O_{12}$ (YAG), is a preferred laser host medium due to low threshold for lasers utilizing rods of YAG single crystals doped with a trivalent rare earth ion such as $Nd^{3+}$. Since laser rods are typically cut from single crystals, growing large size, high quality single crystals of neodymium doped YAG is commercially significant.

Among techniques for growing single crystals suitable for laser application are the Czochralski pulling technique described, for example, in "Growth of Garnet Laser Crystals", by R. C. Linares in *Solid State Communications* 2, No. 8, pages 229–231 (1964) and the flux growth technique of primary concern in the following. The growth of YAG crystals from a melt containing $Y_2O_3$, $Al_2O_3$, PbO, and $PbF_2$ is described in "Growth of Single Crystals of Yttrium Aluminum Garnet from Lead Oxide-Lead Fluoride Melts", By R. A. Lefever, J. W. Torpy, and A. B. Chase in *Journal of Applied Physics*, 32, No. 5 pages 962–963, 1961. Flux growth of rare earth doped YAG from a PbO—$PbF_2$—$B_2O_3$ flux is described in "Growth of Large Optical-Quality Yttrium and Rare Earth Aluminum Garnets", by L. G. Van Uitert, W. H. Grodkiewicz and E. F. Dearborn, in *Journal of the American Ceramic Society*, Vol. 48, No. 2, pages 105–108, 1965. A detailed description of apparatus facilitating flux growth is given in "Growth of Large Yttrium and Rare-Earth Aluminum and Iron Garnets", by W. H. Grodkiewicz, E. F. Dearborn, and L. G. Van Uitert in Crystal Growth, Supplement, *Journal of Physics and Chemistry of Solids*, pages 441–444, 1967.

While these references do disclose the feasibility of flux growth of rare earth doped YAG there remains the concern for growing crystals of large size and high quality.

SUMMARY OF THE INVENTION

By subjecting a melt containing crystal components and flux components to a controlled temperature cycle while maintaining a temperature gradient in the melt, large neodymium doped YAG single crystals are grown which are essentially free from inclusions of extraneous flux components. Specifically, the temperature of the melt is gradually lowered from an initial temperature on the order of 1300° C to an intermediate temperature in the range of from 1050° C to 1200° C, rapidly raised back to the initial temperature and again gradually lowered to the intermediate temperature. After a prolonged hold at the intermediate temperature the temperature is gradually lowered to a final temperature in the range of from 900° C to 950° C at which point the remaining melt is drained before the grown crystals are gradually cooled to room temperature.

DETAILED DESCRIPTION

Figure 1:
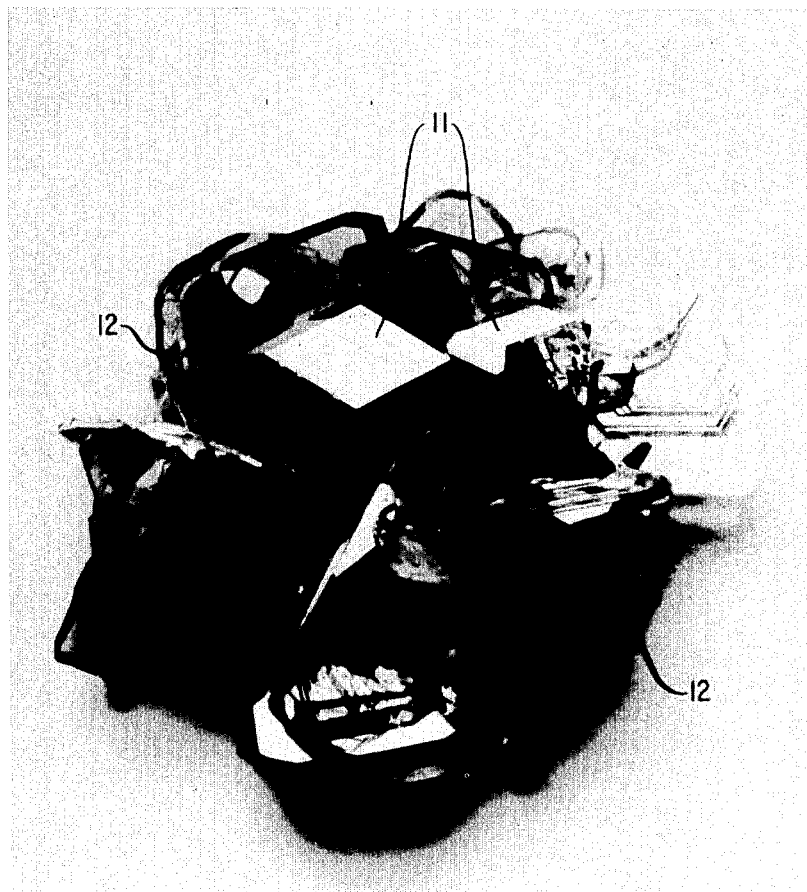
FIG. 1 shows a cluster of crystals grown by the disclosed method.
Figure 2:
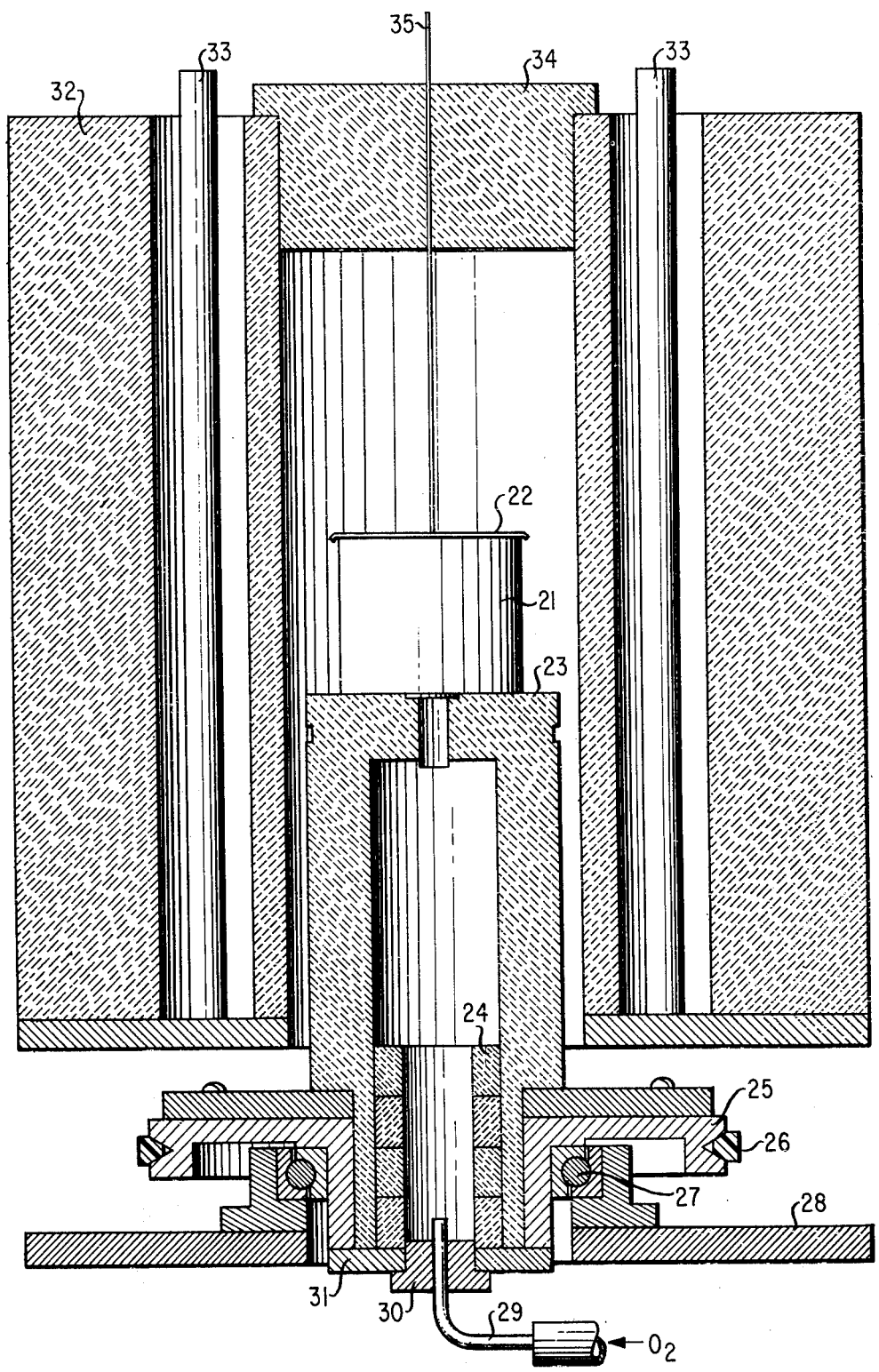
FIG. 2 schematically shows apparatus useful in carrying out the disclosed method.

FIG. 1 shows neodymium doped YAG single crystals 11 surrounded by a cluster of sapphire crystals 12;

FIG. 2 shows crucible 21 covered with lid 22 and resting on pedestal 23 which has a hollow core lined with bricks 24. The pedestal 23 rests on turntable 25 and can be made to rotate by pulley belt drive 26. Turntable 25 is mounted on thrust bearing 27 which is supported by hoist plate 28. Oxygen can be fed into the hollow core of pedestal 23 through pipe 29 which is fitted through bearing 30 in closure plate 31. Pedestal 23 and crucible 21 are situated inside muffle 32 which can be heated by SiC heating elements 33. Muffle 32 is covered with plug 34 which is perforated to allow thermocouple 35 to make contact with lid 22.

The method calls for preparing a melt from a mixture of crystal components $Y_2O_3$, $Nd_2O_3$, and $Al_2O_3$ and flux components PbO, $PbF_2$ and $B_2O_3$, all in powdered form. For the growth of green garnet, $Cr_2O_3$ may be added as an additional crystal component as may be desirable to enhance pumping efficiency of laser rods pumped, e.g., by a mercury flashlamp. The combined amount of crystal components is preferably chosen in the range of from 15 weight percent to 40 weight percent of the mixture. $Nd_2O_3$ is preferably chosen in an amount of from 0.1 weight percent to 20 weight percent of the amount of $Y_2O_5$ and alumina in an amount in excess of the stoichiometric amount by 50 percent to 150 percent. Flux components are preferably chosen as follows: 30 weight percent of 70 weight percent PbO, 0.5 weight percent to ten weight percent $B_2O_3$, remainder $PbF_2$. For the growth of green garnet, the amount of $Cr_2O_3$ is preferably chosen in the range of from 0.02 weight percent to one weight percent of crystal components. The mixture is heated in a container such as a platinum crucible to a temperature on the order of 1300° C and held at this temperature for a period of time such as 24 hours to ensure complete solution of crystal components and uniformity of the melt. Mixing of constituents is conveniently enhanced by rotating the container, the direction of the rotation being reversed periodically. Rotation rates in the vicinity of 30 rpm and reversal of direction of rotation every 30 seconds are suitable for this purpose. While such motion is advantageous during preparation of the melt, the container is preferably held motionless during the cooling cycle described in the following.

It is understood that the use of designations such as "first intermediate temperature" and "second intermediate temperature" as applied to temperatures specified to lie in identical or overlapping ranges is not intended to preclude such temperatures from being equal. Similarly, the use of designations such as "first rate", "second rate", and "third rate", as applied to rates lying in identical or overlapping ranges is not intended to preclude such rates from being equal.

During the cooling cycle a temperature gradient in the range of from 5° C/cm to 80° C/cm is preferably maintained in the melt such as by blowing air or oxygen against the crucible; for the sake of ease of description, it is assumed that it is the bottom of the crucible which is held at a lower temperature. In view of the temperature gradient in the melt, temperatures stated in the following are understood to be average temperatures. Cooling of the melt proceeds as follows: (a) slow cooling at a rate of from 0.1° C/hr to 10° C/hr from the solution temperature on the order of 1300° C to a first intermediate temperature in the range of from 1050° C to 1200° C which is sufficiently low for nucleation of garnet to take place at the bottom of the crucible, (b) reheating of the melt to a temperature near the melting temperature, (c) slow cooling at a rate of from 0.1° C/hr to 3° C/hr to a second intermediate temperature in the range of from 1050° C to 1200° C, (d) maintaining the melt at an essentially constant temperature for several days, and (e) cooling at a rate in the range of from 0.1° C/hr to 3° C/hr to a temperature in the range of from 900° C to 950° C. Intermediate temperatures in the range of from 1050° C to 1200° C are preferably chosen dependent on the concentration of crystal components in the melt with lower temperatures corresponding to lower concentrations.

During cooling step (a) strong supersaturation occurs typically in the melt which, upon nucleation, leads to rapid, dendritic growth of YAG. The reheating in step (b) serves to dissolve nearly all of the dendritic growth, leaving only a few small seeds at the bottom of the crucible. From these seeds crystals grow during cooling step (c); due to the presence of the seeds, high levels of supersaturation are avoided at this stage, and growth is under near-equilibrium conditions. For the growth of green garnet, a cooling rate in the vicinity of 0.3° C/hr was found to be particularly effective during cooling step (c). Step (d) enhances crystal growth at the bottom of the crucible by transfer from crystals that form a crust at the top of the melt. This effect can be enhanced by gradually increasing the temperature gradient in the melt during step (d), preferably to a value on the order of twice the original gradient, such as by increasing the rate of oxygen flow against the bottom of the crucible. It has been observed that increasing the temperature gradient during step (d) promotes primarily the growth of sapphire at the bottom of the crucible which, in turn, is believed to enhance the quality of YAG crystals by slowing their growth. Further growth of crystals occurs during final cooling step (e) which is terminated by draining the remaining melt in order to avoid redissolving the garnet at temperatures near 900° C. While a temperature gradient in the melt is advantageously maintained by a flow of oxygen or air, other means may be used such as a furnace allowing uneven heating of the crucible. However, in the interest of preventing reduction of PbO to Pb in the melt, an atmosphere containing substantial amounts of oxygen should preferably be maintained over the melt.

EXAMPLE I

A platinum crucible ten inches high, eight inches in diameter, and having a wall thickness of 60 mils was used to prepare a melt from a mixture of 720 gm $Y_2O_3$, 253 gm $Nd_2O_3$, 1220 $Al_2O_3$, 3556 PbO, 4346 gm $PbF_2$, and 279 gm $B_2O_3$. The melt was subjected to the temperature cycle disclosed above; cooling rates of 0.3° C/hr were used in each of the cooling steps (a), (c), and (e), and the intermediate temperatures were 1130° C. An oxygen flow rate of eight standard cubic feet per hour was used during steps (a)—(c). Holding in step (d) was for a duration of ten days during which the oxygen flow rate was gradually increased to 32 standard cubic feet per hour. To drain the flux upon cooling to 950° C, the crucible was pierced with a spear introduced from below into the bottom pedestal. The grown cluster of YAG crystals surrounded by sapphire crystal in rosette fashion is shown in FIG. 2.

EXAMPLE II

A melt differing from the melt of Example I in that it also contained 4.4 gm $Cr_2O_3$ was prepared and cooled as the melt of Example I to produce a cluster of green garnet surrounded by ruby.

We claim:

1. A method of growing neodymium-doped yttrium aluminum garnets from a melt of a mixture of flux components PbO, $PbF_2$, $B_2O_3$, and constituent components $Nd_2O_3$, $Y_2O_3$, and $Al_2O_3$ and maintained in an atmosphere containing a substantial amount of oxygen and at an initial temperature on the order of 1300° C CHARACTERIZED IN THAT said melt is (a) cooled at a first rate in the range of from 0.1° C per hour to 10° C per hour to a first temperature in the range of from 1050° C to 1200° C, (b) rapidly reheated to a temperature on the order of 1300° C, (c) cooled at a second rate in the range of from 0.1° C per hour to 3° C per hour to a second temperature in the range of from 1050° C to 1200° C, (d) maintained at said second temperature for a period of from 1–20 days, and (e) cooled at a third rate in the range of from 0.1° C per hour to 3° C per hour to a temperature in the range of from 900° C to 950° C and further CHARACTERIZED IN THAT a temperature gradient in the range of from 5° C/cm to 80° C/cm is maintained in said melt.

2. Method of claim 1 in which the combined amount of crystal components in said melt is chosen in the range of from 15 weight percent to 40 weight percent of said mixture.

3. Method of claim 1 in which alumina is chosen in said mixture in an amount in excess of the stoichiometric amount by 50 to 150 percent.

4. Method of claim 1 in which said flux components are chosen in the ranges of from 30 weight percent to 70 weight percent PbO, 0.5 weight percent to 10 weight percent $B_2O_3$, and remainder $PbF_2$.

5. Method of claim 1 in which $Nd_2O_3$ is chosen in an amount of from 0.1 weight percent to 20 weight percent of the amount of $Y_2O_3$.

6. Method of claim 1 in which said melt also contains $Cr_2O_3$ in an amount in the range of from 0.02 weight percent to one weight percent of the total amount of crystal components.

7. Method of claim 1 in which said first temperature is approximately 1130° C.

8. Method of claim 1 in which said second temperature is approximately 1130° C.

9. Method of claim 1 in which said temperature gradient is increased from an initial value in the range of from 5° C/cm to 40° C/cm to a value on the order of twice the initial value.

* * * * *